(12) United States Patent
Sagmeister et al.

(10) Patent No.: US 11,474,039 B2
(45) Date of Patent: Oct. 18, 2022

(54) CHEMICAL SENSING DEVICE USING FLUORESCENT SENSING MATERIAL

(71) Applicant: ams AG, Premstaetten (AT)

(72) Inventors: Martin Sagmeister, Premstaetten (AT); Victor Sidorov, Premstaetten (AT); Jochen Kraft, Premstaetten (AT)

(73) Assignee: ams AG, Premstaetten (AT)

( * ) Notice: Subject to any disclaimer, the term of this patent is extended or adjusted under 35 U.S.C. 154(b) by 254 days.

(21) Appl. No.: 16/766,179

(22) PCT Filed: Nov. 28, 2018

(86) PCT No.: PCT/EP2018/082867
§ 371 (c)(1),
(2) Date: May 21, 2020

(87) PCT Pub. No.: WO2019/106023
PCT Pub. Date: Jun. 6, 2019

(65) Prior Publication Data
US 2020/0284727 A1 Sep. 10, 2020

(30) Foreign Application Priority Data
Dec. 1, 2017 (EP) .................... 17204932

(51) Int. Cl.
*G01N 21/64* (2006.01)
*G01N 21/77* (2006.01)
(Continued)

(52) U.S. Cl.
CPC ....... *G01N 21/6402* (2013.01); *G01N 21/643* (2013.01); *G01N 21/6486* (2013.01);
(Continued)

(58) Field of Classification Search
CPC ............ G01N 21/6402; G01N 21/643; G01N 21/6486; G01N 21/77; G01N 21/7703;
(Continued)

(56) References Cited

U.S. PATENT DOCUMENTS

| 4,755,667 A | 7/1988 | Marsoner et al. |
| 6,078,705 A | 6/2000 | Neuschäfer et al. |

(Continued)

FOREIGN PATENT DOCUMENTS

TW 200925568 6/2009

OTHER PUBLICATIONS

Wang, J. et. al.: "Optical carbon dioxide sensor based on fluorescent capillary array".
European Patent Office, International Search Report for PCT/EP2018/082867 dated Dec. 19, 2018.

*Primary Examiner* — Jill A Warden
*Assistant Examiner* — Henry H Nguyen
(74) *Attorney, Agent, or Firm* — MH2 Technology Law Group LLP

(57) ABSTRACT

The chemical sensing device comprises a substrate of semiconductor material, integrated circuit components and a photodetector formed in the substrate, a dielectric on the substrate, a wiring in the dielectric, and a source of electromagnetic radiation, a waveguide and a fluorescent sensor layer arranged in or above the dielectric. A portion of the waveguide is arranged to allow the electromagnetic radiation emitted by the source of electromagnetic radiation to be coupled into the waveguide. A further portion of the waveguide is arranged between the photodetector and the fluorescent sensor layer.

11 Claims, 3 Drawing Sheets

(51) Int. Cl.
    *G02B 6/12* (2006.01)
    *G02B 6/42* (2006.01)
    *H01L 27/146* (2006.01)
(52) U.S. Cl.
    CPC ......... *G01N 21/77* (2013.01); *G01N 21/7703* (2013.01); *G02B 6/12004* (2013.01); *G02B 6/42* (2013.01); *G02B 6/4214* (2013.01); *H01L 27/146* (2013.01); *G01N 2021/6417* (2013.01); *G01N 2021/6439* (2013.01); *G01N 2021/7716* (2013.01); *G01N 2021/7786* (2013.01); *G02B 2006/12104* (2013.01); *G02B 2006/12107* (2013.01); *G02B 2006/12109* (2013.01)
(58) Field of Classification Search
    CPC ... G01N 2021/6417; G01N 2021/6439; G01N 2021/7716; G01N 2021/7786; G02B 6/12004; G02B 6/42; G02B 6/4214; G02B 2006/12104; G02B 2006/12107; G02B 2006/12109; H01L 27/146
    See application file for complete search history.

(56) References Cited

U.S. PATENT DOCUMENTS

| | | | |
|---|---|---|---|
| 6,483,096 B1 | 11/2002 | Kunz et al. | |
| 8,349,605 B1* | 1/2013 | Lear | G01N 21/552 436/514 |
| 2005/0053319 A1* | 3/2005 | Doan | G02B 6/12 385/14 |
| 2006/0197960 A1* | 9/2006 | Bazylenko | G01N 21/253 356/491 |
| 2008/0180673 A1* | 7/2008 | Sampas | G01N 21/648 356/432 |
| 2009/0087137 A1* | 4/2009 | Doan | B82Y 20/00 385/14 |
| 2011/0013868 A1* | 1/2011 | Suzumura | G02B 6/42 385/32 |
| 2013/0156642 A1 | 6/2013 | Lous | |
| 2015/0285998 A1* | 10/2015 | Babakhani | H01L 31/18 438/27 |
| 2017/0003227 A1* | 1/2017 | Peumans | G01N 21/648 385/14 |

* cited by examiner

CHEMICAL SENSING DEVICE USING FLUORESCENT SENSING MATERIAL

BACKGROUND OF THE INVENTION

Gas detection by some types of opto-chemical gas sensors is based on a measurement of the fluorescence of a sensing material that changes its optical properties upon exposure to specific gases. Such a gas sensor is provided with a light source, and the sensing material, which may typically be a fluorescent dye, is arranged as a thin layer, so that it can be exposed to the gas and to the light from the light source.

The fluorescence that is displayed by the sensing material upon irradiation is detected by a photodetector. Its wavelength is usually greater than the wavelength of the exciting light emitted by the light source. There is a variety of optical properties that may be affected by a reaction between the gas and the sensing material, like spectral response, fluorescence intensity or fluorescence lifetime, for example, which allow to identify the gas and typical properties of the gas.

A high sensitivity of the photodetector is important, because only a very small portion of the light that is incident on the sensing material is converted by fluorescence. In order to make the distance between the photodetector and the sensing material as small as possible, the light source should not be placed in between. On the other hand, an illumination of both the sensing material and the photodetector by the exciting light is to be avoided, as the photodetector is ideally only exposed to the fluorescence.

SUMMARY OF THE INVENTION

The chemical sensing device comprises a substrate of semiconductor material, integrated circuit components and a photodetector formed in the substrate, a dielectric on the substrate, a wiring in the dielectric, the wiring providing electric connections for the integrated circuit components and the photodetector, a source of electromagnetic radiation arranged in or above the dielectric, and a fluorescent sensor layer arranged in or above the dielectric. A waveguide is arranged in or above the dielectric. A portion of the waveguide is arranged at the source of electromagnetic radiation, so that the electromagnetic radiation emitted by the source of electromagnetic radiation is coupled into the waveguide. A further portion of the waveguide is arranged between the photodetector and the fluorescent sensor layer. The source of electromagnetic radiation may be a vertical-cavity surface-emitting laser (VCSEL) or a light-emitting diode (LED), for instance.

An embodiment of the chemical sensing device comprises a grating in the portion of the waveguide that is arranged at the source of electromagnetic radiation, and a further grating in the portion of the waveguide that is arranged between the photodetector and the fluorescent sensor layer.

A further embodiment comprises scattering particles at the portion of the waveguide that is arranged between the photodetector and the fluorescent sensor layer.

A further embodiment comprises a mirror in the portion of the waveguide that is arranged between the photodetector and the fluorescent sensor layer, the mirror being inclined with respect to a direction of propagation of the electromagnetic radiation in the waveguide.

A further embodiment comprises an optical filter arranged between the waveguide and the photodetector. The optical filter blocks the electromagnetic radiation emitted by the source of electromagnetic radiation and is transparent to radiation generated in the fluorescent sensor layer.

A further embodiment comprises a mirror layer arranged between the waveguide and the photodetector. The mirror layer reflects the electromagnetic radiation emitted by the source of electromagnetic radiation.

A further embodiment comprises a carrier, which is transparent to the electromagnetic radiation emitted by the source of electromagnetic radiation and to radiation generated in the fluorescent sensor layer. The fluorescent sensor layer is applied on the carrier.

In a further embodiment the fluorescent sensor layer is directly applied on the waveguide or on a cladding layer of the waveguide.

In a further embodiment the waveguide and the photodetector are arranged at a distance of less than 10 μm from one another.

The fluorescent sensor layer may especially provide a gas sensor or a bio sensor.

The following is a more detailed description of examples of the chemical sensing device in conjunction with the appended figures.

DETAILED DESCRIPTION

Figure 1:
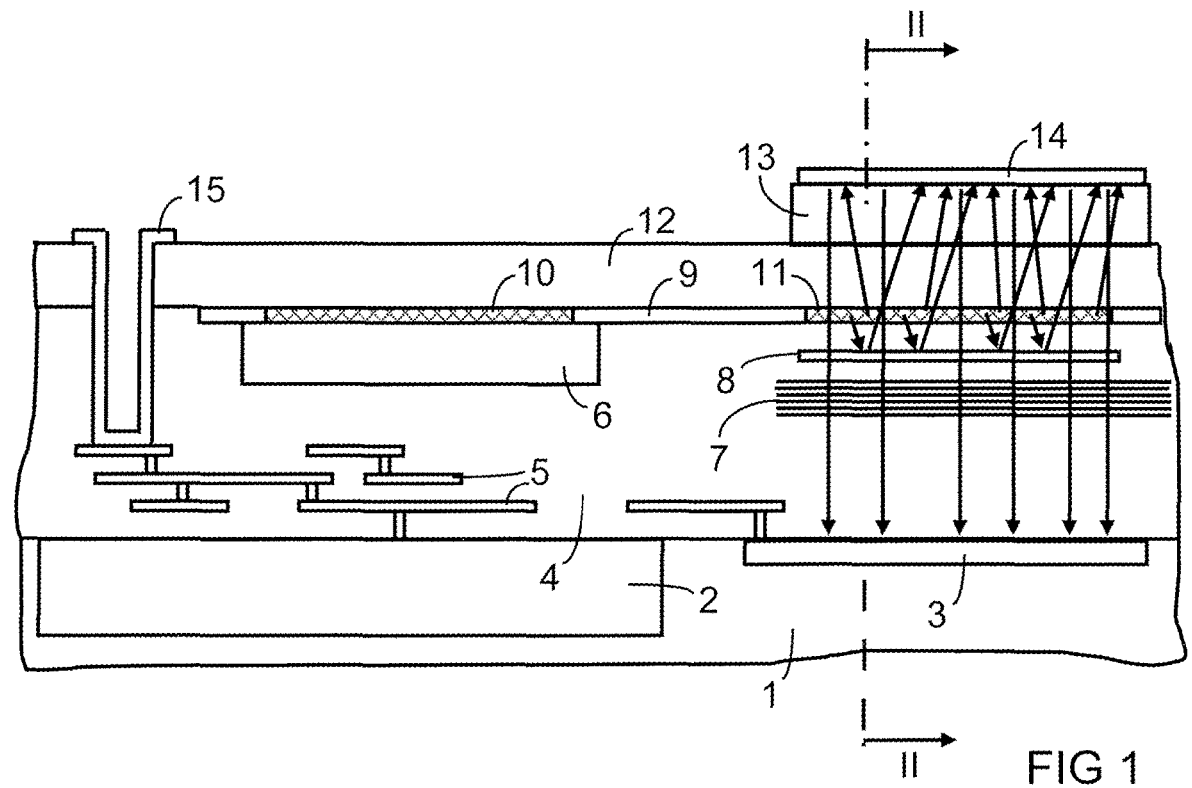
FIG. 1 is a cross section of a chemical sensing device.

FIG. 1 is a cross section of a CMOS-compatible chemical sensing device comprising a waveguide. Components of an integrated circuit 2 and a photodetector 3, which may be a photodiode, for instance, are formed in a substrate 1 of semiconductor material, which may be silicon, for instance. A dielectric 4 with embedded metal layers forming a wiring 5 is arranged above the substrate 1. The wiring 5 provides electric connections for the integrated circuit components 2 and the photodetector 3. The components of an integrated circuit 2, the photodetector 3, the dielectric 4, and the wiring 5 may be formed in a conventional CMOS process, for instance. FIG. 1 also shows a contact connection 15 for external electric connection, by way of example.

A source of electromagnetic radiation 6, which may be a vertical-cavity surface-emitting laser (VCSEL) or a light-emitting diode (LED), for instance, is arranged in or above the dielectric 4. The source of electromagnetic radiation 6 may be monolithically integrated, as shown in FIG. 1, or it may be provided by an external device. A waveguide 9 is arranged at the source of electromagnetic radiation 6, so that the electromagnetic radiation emitted by the source of electromagnetic radiation 6 can enter the waveguide 9. The electromagnetic radiation may be coupled into the waveguide 9 by a diffraction grating 10, for instance. Butt coupling may be employed instead of the grating 10.

The waveguide 9 may be provided with cladding layers, which may also function as optical confinement of the guided electromagnetic radiation. Cladding or confinement layers of waveguides are known per se and are not represented in the figures. A cover layer 12, which is transparent to the electromagnetic radiation from the source 6 and to the light generated by fluorescence of the sensing material, may be applied to cover the waveguide 9.

The electromagnetic radiation emitted by the source 6 is guided through the waveguide 9 to a region that is provided for sensing. A fluorescent sensing layer 14 is arranged above the photodetector 3. The material of the fluorescent sensing layer 14 may be selected for a gas sensor or a bio sensor. In the embodiment according to FIG. 1, the fluorescent sensing layer 14 is applied on a transparent carrier 13, which is optional. Such a carrier 13 may be particularly favourable if an easy replacement of the fluorescent sensor layer 14 is desired after each measurement. The fluorescent sensing layer 14 may instead be applied on the cover layer 12 or immediately on the waveguide 9.

A portion of the waveguide 9 extends between the photodetector 3 and the fluorescent sensing layer 14. A further grating 11 can be provided in this portion of the waveguide 9 to diffract the electromagnetic radiation out of the waveguide 9 towards the fluorescent sensing layer 14.

The electromagnetic radiation that is released from the waveguide 9 also propagates in the direction towards the photodetector 3. As this is not desired, a monolithically integrated filter layer 7 is arranged between the photodetector 3 and the waveguide 9. The filter layer 7, which may be an interference filter, for instance, is a band-pass filter configured to block the electromagnetic radiation emitted by the source 6. The filter layer 7 is transparent to the electromagnetic radiation generated in the fluorescent sensor layer 14 and thus enhances the detection of the fluorescence in relation to the much stronger exciting light from the source 6.

In order to increase the low conversion rate of the exciting light into fluorescence, a mirror layer 8 may additionally be provided. The electromagnetic radiation that is diffracted from the waveguide 9 towards the photodetector 3 is thereby reflected in the opposite direction towards the fluorescent sensor layer 14. The mirror layer 8 may be a thin metal layer, for instance.

Several different directions of propagation of the electromagnetic radiation are indicated in FIG. 1 with arrows, by way of example. The electromagnetic radiation reaches the fluorescent sensor layer 14 directly from the waveguide 9 or via reflection at the mirror layer 8. Electromagnetic radiation generated in the fluorescent sensor layer 14 and detected by the photodetector 3 is indicated in FIG. 1 by longer vertical arrows.

The use of the waveguide 9 allows to keep the distance between the photodetector 3 and the fluorescent sensor layer 14 small. In particular, the distance between the photodetector 3 and the waveguide 9 may be smaller than 10 µm. The distance between the photodetector 3 and the filter layer 7 may be typically 6.5 µm, and the distance between the filter layer 7 and the waveguide 9 typically 3 µm, for example.

Figure 2:
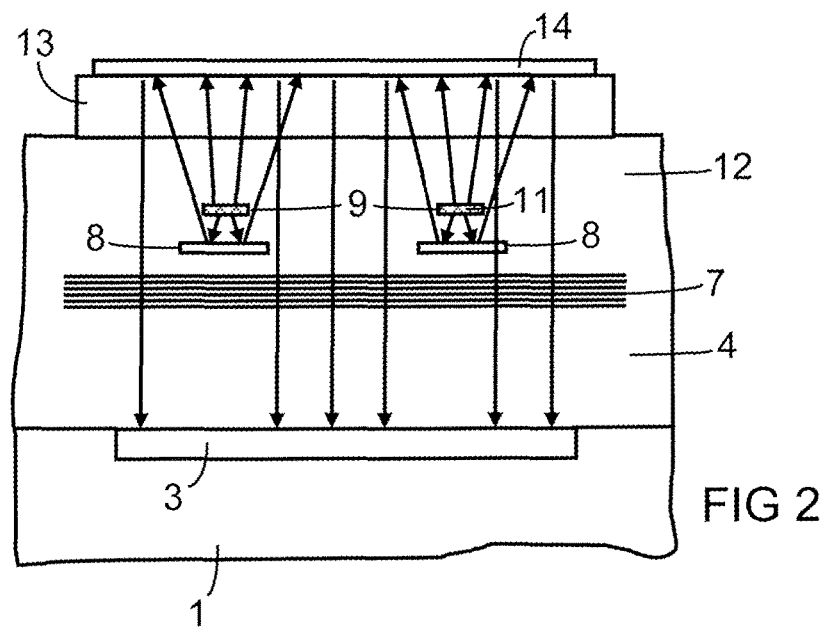
FIG. 2 is a further cross section of the chemical sensing device according to FIG. 1 at the position indicated in FIG. 1.

FIG. 2 is a cross section of the chemical sensing device at the position indicated in FIG. 1. The elements of FIG. 2 that correspond to elements shown in FIG. 1 are indicated with the same reference numerals. FIG. 2 shows two separate waveguides 9 at the position of the further grating 11; the number of individual waveguides in the device is arbitrary. The size of the mirror layer 8, which can be provided for each waveguide 9 separately, can be adapted to the width of the waveguide 9. The mirror layer 8 may only be present below the waveguide 9 and cover only a portion of the area of the photodetector 3, especially less than 50% of its area, for instance. In particular, the lateral extension of the waveguide 9 may be smaller than the lateral extension of the mirror layer 8, as shown in FIG. 2 by way of example. The filter layer 7 may also be provided for each waveguide separately, or it may be formed as an entire layer completely covering the area of the photodetector 3, as in FIG. 2.

Figure 3:
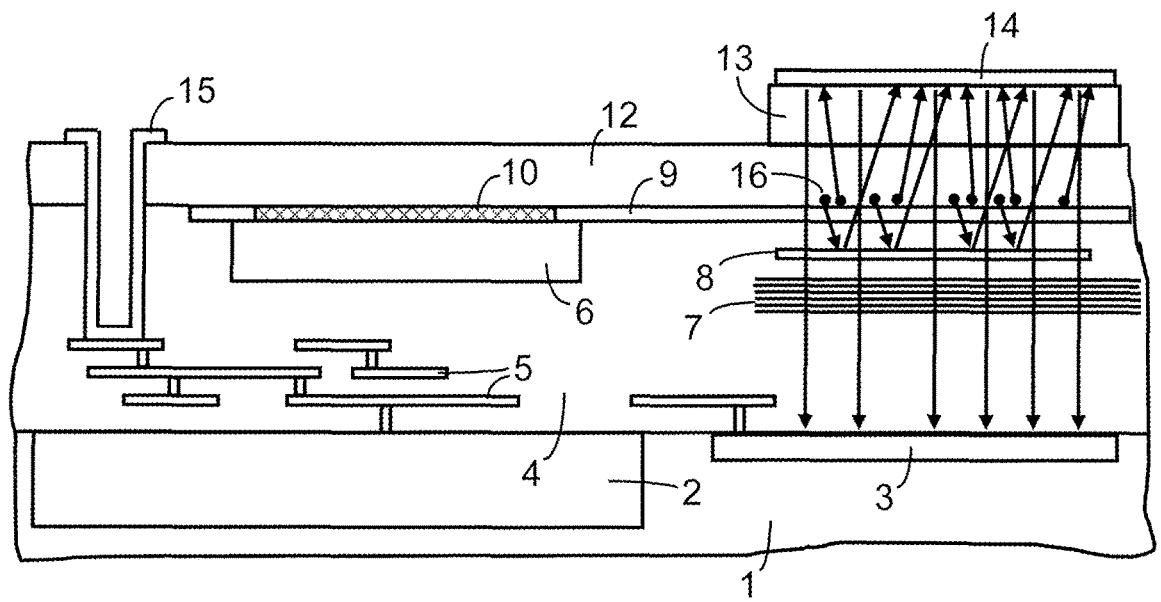
FIG. 3 is a cross section of a further chemical sensing device comprising scattering particles.

FIG. 3 is a cross section of a further CMOS-compatible chemical sensing device. Elements of the device according to FIG. 3 that correspond to elements of the device according to FIG. 1 are indicated with the same reference numerals. In the device shown in FIG. 3, scattering particles 16 are arranged at the portion of the waveguide 9 that is present between the photodetector 3 and the fluorescent sensor layer 14. The scattering particles 16, which may be $TiO_2$, for instance, scatter the guided electromagnetic radiation out of the waveguide 9. The scattering particles 16 substitute the further grating 11 used in the device according to FIG. 1.

Figure 4:
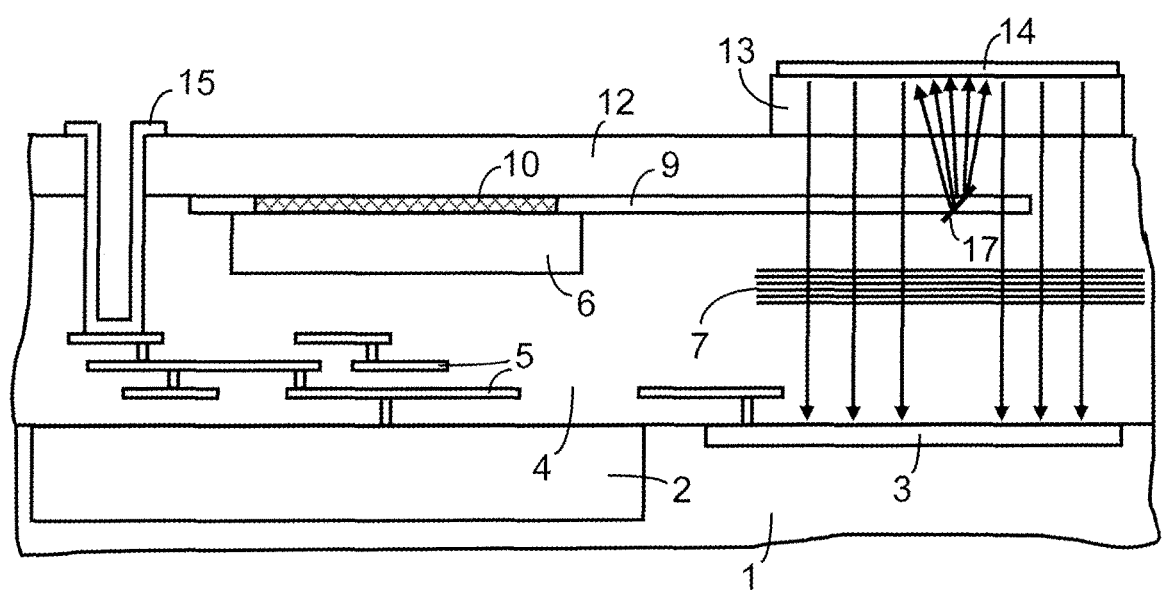
FIG. 4 is a cross section of a further chemical sensing device comprising a waveguide mirror.

FIG. 4 is a cross section of a further CMOS-compatible chemical sensing device. Elements of the device according to FIG. 4 that correspond to elements of the device according to FIG. 1 are indicated with the same reference numerals. In the device shown in FIG. 4, a waveguide mirror 17 is arranged in the portion of the waveguide 9 that is present between the photodetector 3 and the fluorescent sensor layer 14. The waveguide mirror 17 is inclined with respect to the direction of propagation of the electromagnetic radiation in the waveguide 9 and reflects the guided electromagnetic radiation out of the waveguide 9. The waveguide mirror 17 substitutes the further grating 11 used in the device according to FIG. 1.

Figure 5:
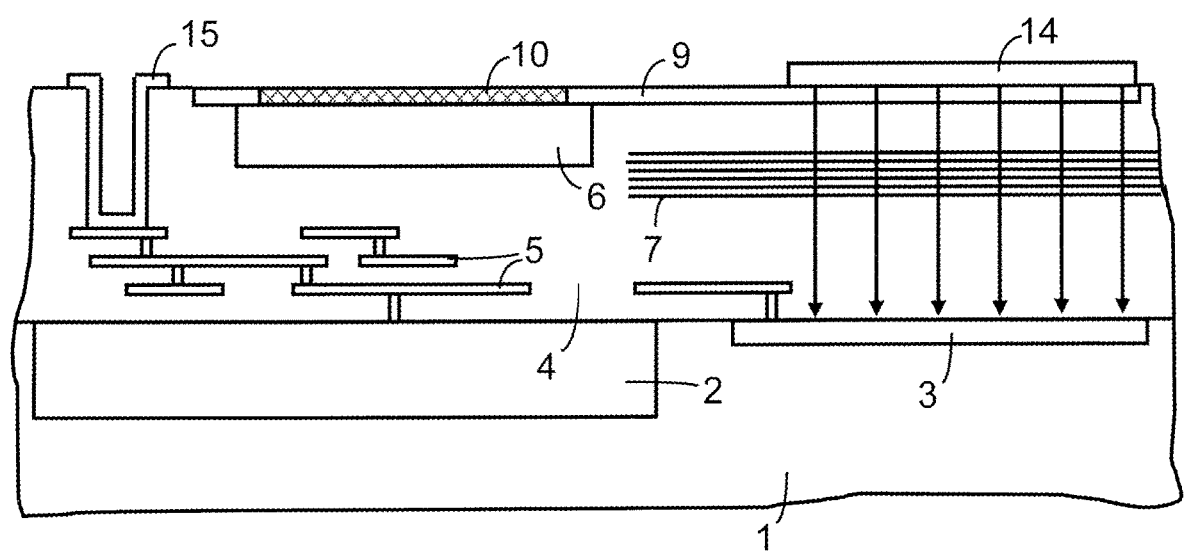
FIG. 5 is a cross section of a further chemical sensing device having a fluorescent sensor layer directly applied to a waveguide.

FIG. 5 is a cross section of a further CMOS-compatible chemical sensing device. Elements of the device according to FIG. 5 that correspond to elements of the device according to FIG. 1 are indicated with the same reference numerals. In the device shown in FIG. 5, the waveguide 9 is not covered, and the fluorescent sensor layer 14 is directly applied on the waveguide 9. In order to obtain an exposure of the fluorescent sensor layer 14 to the exciting light from the source 6, the evanescent light field is exploited, and no distortion within the waveguide 9 is required to couple the electromagnetic radiation out of the waveguide 9. In this embodiment the optional mirror layer 8 is of minor importance and therefore omitted in FIG. 5.

In a suitable production method for the chemical sensing device, all layers are applied on the substrate that is provided with the integrated circuit components 2 and the photodetector 3. The wiring 5 and the filter layer 7 are arranged in and on the dielectric 4 according to a conventional back end of line (BEOL), especially of a standard CMOS process. Cladding layers and the waveguide are formed, and the fluorescent sensor layer 14 is applied for a gas sensor or a bio sensor.

In an alternative production method, the waveguide 9 and one metal layer provided for the mirror layer 8 are formed on a second substrate, which is then bonded to the substrate 1 comprising the integrated circuit components 2, the photodetector 3 and the wiring 5. The filter layer 7 can be formed on either substrate and provided with a planarization layer, especially an oxide layer.

The described chemical sensing device allows a substantial reduction of the size of a fluorescence-based sensor and considerably increases the amount of detected fluorescence while minimizing the amount of exciting light that reaches the photodetector.

The invention claimed is:

1. A chemical sensing device, comprising:
   a substrate of semiconductor material,
   integrated circuit components and a photodetector formed in the substrate,
   a dielectric on the substrate,
   a wiring in the dielectric, the wiring providing electric connections for the integrated circuit components and the photodetector,
   a source of electromagnetic radiation arranged in or above the dielectric, and
   a fluorescent sensor layer arranged in or above the dielectric,
   wherein
   a waveguide is arranged in or above the dielectric,
   a portion of the waveguide is arranged at the source of electromagnetic radiation, the electromagnetic radiation emitted by the source of electromagnetic radiation being coupled into the waveguide,
   a further portion of the waveguide is arranged between the photodetector and the fluorescent sensor layer, and
   a mirror layer arranged between the waveguide and the photodetector, the mirror layer reflecting the electromagnetic radiation emitted by the source of electromagnetic radiation.

2. The chemical sensing device according to claim 1, further comprising:
   a grating in the portion of the waveguide that is arranged at the source of electromagnetic radiation, and
   a further grating in the portion of the waveguide that is arranged between the photodetector and the fluorescent sensor layer.

3. The chemical sensing device according to claim 1, further comprising:
   scattering particles at the portion of the waveguide that is arranged between the photodetector and the fluorescent sensor layer.

4. The chemical sensing device according to claim 1, further comprising:
   an optical filter arranged between the waveguide and the photodetector, the optical filter blocking the electromagnetic radiation emitted by the source of electromagnetic radiation and being transparent to radiation generated in the fluorescent sensor layer.

5. The chemical sensing device according to claim 1, further comprising:
   a carrier, which is transparent to the electromagnetic radiation emitted by the source of electromagnetic radiation and to radiation generated in the fluorescent sensor layer, the fluorescent sensor layer being applied on the carrier.

6. The chemical sensing device according to claim 1, wherein the fluorescent sensor layer is directly applied on the waveguide.

7. The chemical sensing device according to claim 1, wherein the source of electromagnetic radiation is a vertical-cavity surface-emitting laser.

8. The chemical sensing device according to claim 1, wherein the waveguide and the photodetector are arranged at a distance from one another that is less than 10 μm.

9. The chemical sensing device according to claim 1, wherein the fluorescent sensor layer provides a gas sensor.

10. The chemical sensing device according to claim 1, wherein the fluorescent sensor layer provides a bio sensor.

11. A chemical sensing device, comprising:
    a substrate of semiconductor material,
    integrated circuit components and a photodetector formed in the substrate,
    a dielectric on the substrate,
    a wiring in the dielectric, the wiring providing electric connections for the integrated circuit components and the photodetector,
    a source of electromagnetic radiation arranged in or above the dielectric, and
    a fluorescent sensor layer arranged in or above the dielectric,
    wherein a waveguide is arranged in or above the dielectric,
    a portion of the waveguide is arranged at the source of electromagnetic radiation, the electromagnetic radiation emitted by the source of electromagnetic radiation being coupled into the waveguide, and
    a further portion of the waveguide is arranged between the photodetector and the fluorescent sensor layer, and
    a mirror in the further portion of the waveguide that is arranged between the photodetector and the fluorescent sensor layer, the mirror being inclined with respect to a direction of propagation of the electromagnetic radiation in the waveguide.

* * * * *